US010566508B2

(12) United States Patent
Pan et al.

(10) Patent No.: US 10,566,508 B2
(45) Date of Patent: Feb. 18, 2020

(54) MOLDED SURFACE MOUNT DEVICE LED DISPLAY MODULE

(71) Applicant: SCT TECHNOLOGY, LTD., Grand Cayman (KY)

(72) Inventors: Chang Hung Pan, Milpitas, CA (US); Heng Liu, Milpitas, CA (US); Eric Li, Milpitas, CA (US); Shihfeng Shao, Milpitas, CA (US)

(73) Assignee: SCT LTD., Grand Cayman (KY)

( * ) Notice: Subject to any disclaimer, the term of this patent is extended or adjusted under 35 U.S.C. 154(b) by 0 days.

(21) Appl. No.: 15/984,017

(22) Filed: May 18, 2018

(65) Prior Publication Data

US 2019/0355884 A1 Nov. 21, 2019

(51) Int. Cl.
*H01L 33/00* (2010.01)
*H01L 33/56* (2010.01)
*H01L 27/15* (2006.01)
*H01L 33/62* (2010.01)
*H01L 33/54* (2010.01)
*H01L 33/48* (2010.01)

(52) U.S. Cl.
CPC ............ *H01L 33/56* (2013.01); *H01L 27/156* (2013.01); *H01L 33/486* (2013.01); *H01L 33/54* (2013.01); *H01L 33/62* (2013.01); *H01L 2933/005* (2013.01)

(58) Field of Classification Search
CPC ..... H01L 27/156; H01L 33/486; H01L 33/54; H01L 33/62
USPC .............................................. 257/98, 89, 100
See application file for complete search history.

(56) References Cited

U.S. PATENT DOCUMENTS

| 5,399,850 | A | * | 3/1995 | Nagatani | G06K 7/14 250/208.1 |
| 8,507,927 | B2 | * | 8/2013 | Iida | H05K 1/181 257/88 |
| 10,121,942 | B2 | * | 11/2018 | Shirahama | H01L 33/52 |
| 2006/0186425 | A1 | * | 8/2006 | Yano | F21K 9/68 257/98 |
| 2011/0254039 | A1 | * | 10/2011 | Kim | H01L 33/46 257/98 |

* cited by examiner

*Primary Examiner* — Tan N Tran
(74) *Attorney, Agent, or Firm* — Novick, Kim & Lee, PLLC; Allen Xue

(57) ABSTRACT

A light emitting diode (LED) display module includes an array of surface-mount devices (SMDs) arranged in rows and columns on a substrate. Each SMD has red, green, and blue LED chips connected to the substrate and a first transparent resin portion molded around the LED chips; a black resin portion molded around each SMD in a manner to fill spaces between SMDs so as to block light emitted from a sidewall of each SMD; and a second transparent resin portion molded on the first transparent resin portion and the black resin portion.

18 Claims, 6 Drawing Sheets

Top LED

Top LED

Chip LED

Top LED

Chip LED

MOLDED SURFACE MOUNT DEVICE LED DISPLAY MODULE

BACKGROUND

1. Field

The following description relates to electronic packaging, and more particularly, to a molded surface-mount device (SMD) light-emitting diode (LED) display module with reduced color shift that can be used in various lighting applications.

2. Description of Related Art

LED packages are assemblies that house LED chips. There are many types of LED packages in use today, each with particular applications and advantages. The functions of LED packages include protecting the LED chips and welded lead wires from direct contact with the environmen, securing and encapsulating the chip with epoxy or silicone resin, and allowing for versatility and stanardization in LED lighting applications.

The SMD LED display module is an LED display module that uses surface-mount technology (SMT) to mount LED packages onto a printed circuit boards (PCB) surface via welding. SMT is a method for producing electronic circuits in which the components are mounted or placed directly onto PCBs. An electronic device so made is called a surface-mount device (SMD).

The surface-mount LED device is designed to function on its own or to be plugged into a compatible unit. There are many types of SMD LED modules that are distinguishable according to the physical dimensions of the LED chip.

After being welded onto circuit boards, SMD LED modules are widely used in backlighting for computer monitor or TV screes, or in LED lamps for home illumination, advertising, automobile interior lighting and numerous other lighting applications. The brightness may vary depending on the driving current. The output light and consumed power depend on the LED chip.

SMD LEDs are often used in LED light strips and can be installed in a variety of places because of their excellent versatility. The packaging material is typically made of ceramics or plastics, though many plastics cannot withstand the high LED junction temperature.

The SMD LED display module generally comprises a driver PCB carrying a large number of surface-mount LED devices arranged in rows and columns. Each SMD LED device may carry a vertically oriented, linear array of red, green and blue LEDs defining a pixel. The SMD LED devices are electrically connected to pads on the PCB connected to respond to appropriate electrical signal processing and driver circuitry.

Different types of SMD LEDs according to the package structure are available. The first type of the SMD LED is a top-emitting LED ("Top LED") that comprises a black sidewall defining a cavity, LEDs placed on a lead frame, and a transparent resin encapsulation molded around the LED chips. The top-emitting LED or Top LED is typically used for electronic equipment such as dashboard and signal LED board. It is widely used for indoor and outdoor decorative light.

In the top-emitting LED, light generated by each LED is emitted upward and sideward. However, because of the black sidewall formed around the LED chips, the light emitted sideward is blocked so that the light is emitted only upward. One issues of this technology is that the upper surface of the Top LED is generally uneven due to the resin filling and curing process. The structure of the top-emitting LED will be described in more detail in the detailed description section.

The second type of the SMD LED is a side and top-emitting LED ("Chip LED") comprising LED chips placed on a lead frame, bonding wires connecting the LED chips to the lead frame, and a transparent resin encapsulation molded around the LED chips.

The use of the Chip LED is similar to that of the Top LED. However, unlike the Top LED, the Chip LED emits light both in the top and side directions because the LED chips are not surrounded by the black sidewall. Further, unlike the Top LED, the top surface of the Chip LED is generally flat. The structure of the Chip LED will be further described in the detailed description section below.

When two or more Top LEDs are put together on a PCB to form a SMD LED display module, the resulting light pattern exhibits a certain level of color shift over viewing angles due to the uneven top surface and variation of the uneven top surface between Top LEDs. Because the light generated by each LED bounces within the cavity defined by the black sidewall before the light is emitted in the vertical direction, all red, green and blue color radiations closely follow Lambertian light pattern. Accordingly, the color shift over the viewing angle variations in the Top LED is less than that in the Chip LED.

However, for Chip LEDs, the light radiated from all sides of the Chip LED causes a more severe color shift over the viewing angle variations than the Top LED because of the irregularity of resin cutting and the sharp angle of the encapsulation in a square shape, which causes light leakage and results in noisy images.

When a color shift occurs in the SMD LED display module, the image becomes blurred, and the contrast and uniformity of the image are deteriorated. Therefore, there is a need for an improved packaging method and structure that can reduce the occurrence of the color shift over the viewing angles in the SMD LED display module.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The purpose of the present disclosure is to resolve the aforementioned problem of the conventional technique, that is, to provide a light emitting diode (LED) display module with reduced color shift over viewing angle variations.

In one general aspect, a light emitting diode (LED) display module comprises an array of surface-mount devices (SMDs) arranged in rows and columns on a substrate. Each SMD comprises red, green and blue LED chips connected to the substrate, and a first transparent resin portion molded around the LED chips. The LED display module further comprises a black resin portion molded around each SMD in a manner to fill spaces between SMDs so as to prevent light from emitting from a sidewall of the SMD, and a second transparent resin portion molded on the first transparent resin portion and the black resin portion.

In another general aspect, a light emitting diode (LED) display module comprises an array of surface-mount devices (SMDs) arranged in a matrix on a substrate, each SMD comprising red, green and blue LED chips, a black side wall defining a cavity, and a first transparent resin portion molded in the cavity; and a second transparent resin portion molded on the first transparent resin portion and molded around each SMD in a manner to fill spaces between SMDs.

In yet another general aspect, a method for fabricating a light emitting diode (LED) display module comprises providing an array of surface-mount devices (SMDs) arranged in a matrix on a substrate, each SMD comprising red, green and blue LED chips connected to the substrate and a first transparent resin portion molded around the LED chips; forming a black resin portion molded around each SMD in a manner to fill spaces between SMDs so as to block light emitted from a sidewall of each SMD; and forming a second transparent resin portion on the first transparent resin portion and the black resin portion.

Other features and aspects will be apparent from the following detailed description, the drawings, and the claims.

Figure 1A:
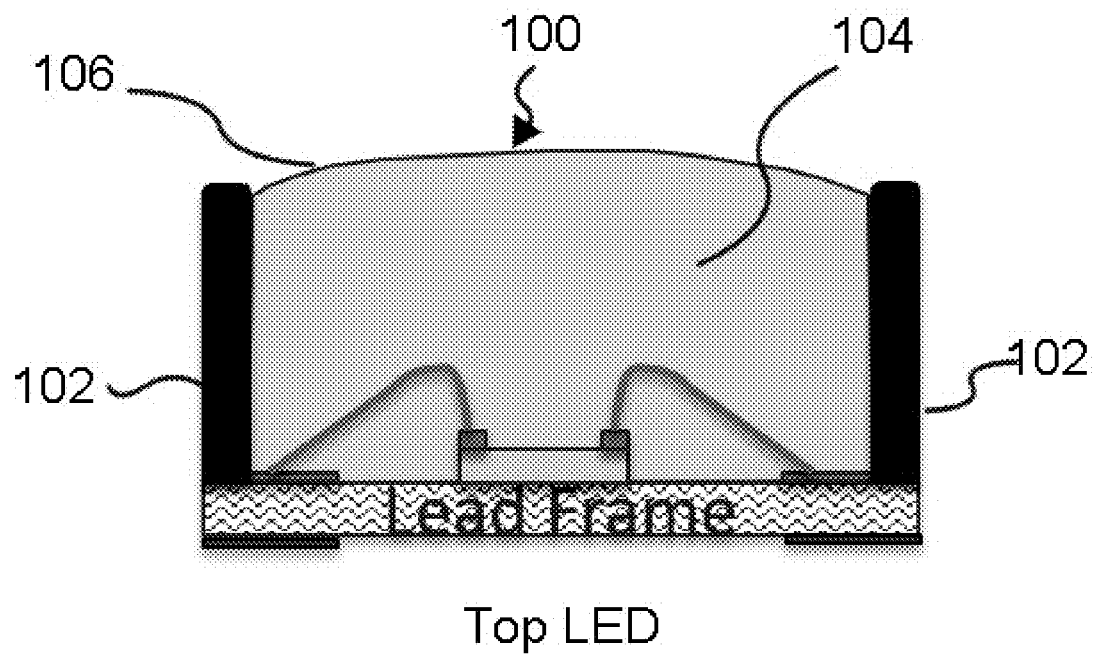
FIG. 1A is a view schematically illustrating a lateral cross section of a top-emitting LED package.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses, and/or methods described herein will be apparent to one of ordinary skill in the art.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Hereinafter, a light emitting diode (LED) display module configured to reduce color shift over viewing angle variations and a method for fabricating the same according to an embodiment of the present disclosure will be explained in more detail with reference to the drawings attached.

Figure 1B:
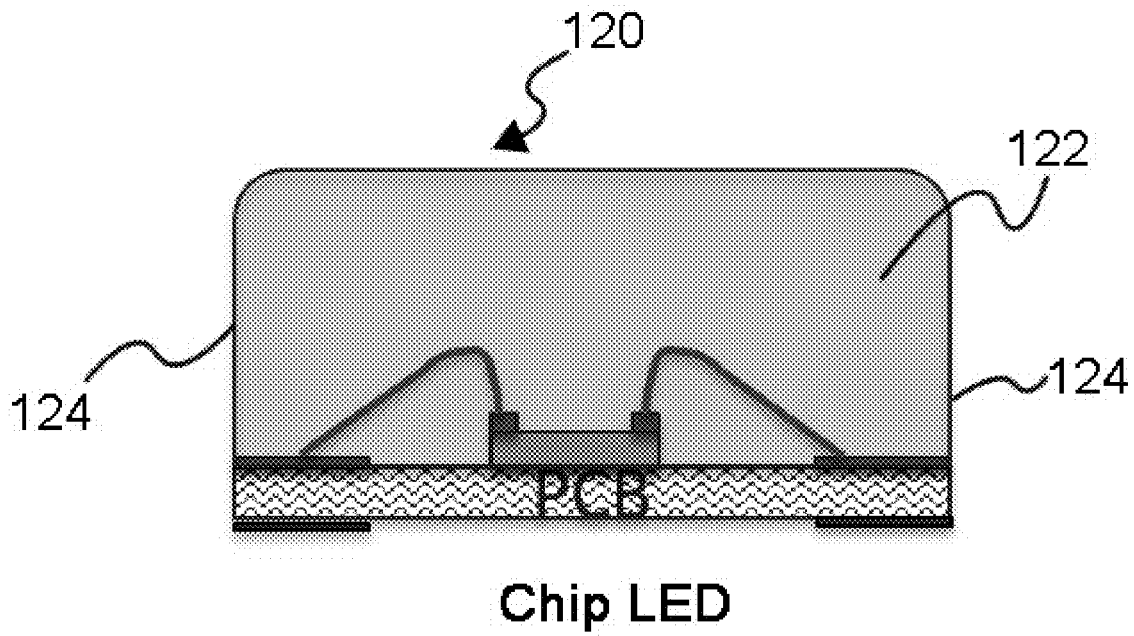
FIG. 1B is a view schematically illustrating a lateral cross section of a side and top-emitting LED package.

FIG. 1A is a view schematically illustrating a lateral cross section of a top-emitting LED package, and FIG. 1B is a view schematically illustrating a lateral cross section of a side and top-emitting LED package.

As illustrated in FIGS. 1A and 1B, an LED display module according to an embodiment of the present disclosure may include a top-emitting LED package 100 or a side and top-emitting LED package 130.

Referring to FIG. 1A, the top-emitting LED package 100 according to this embodiment may include a black sidewall 102 configured to prevent light from emitting sideward; red, green, and blue LED chips placed in a linear manner on a lead frame; a transparent resin portion 104 molded around the LED chips; and bonding wires electrically connecting the LED chips to a printed circuit board (PCB). In this embodiment, the PCB may constitute a substrate on which a plurality of top-emitting LED packages may be placed in rows and columns.

In this embodiment, the top-emitting LED shows very good characteristics in terms of contrast, uniformity, and color shift over viewing angle variations. However, referring to FIG. 1A, the resin portion 104 of the top-emitting LED package 100 typically has an uneven surface 106 due to the resin fill process, such as nozzle injection of resins (e.g., an epoxy or a silicone) followed by the curing process.

Due to the uneven surface 106, the color shift over the viewing angles may occur when a plurality of top-emitting LED packages are put together on a PCB substrate to form a LED display module. The degradation of the color shift characteristics may be caused by the uneven top surface of each LED package and variations in the surface topology among the top-emitting LED packages.

Referring to FIG. 1B, the side and top-emitting LED package 120 according to an embodiment includes red, green and blue LED chips; a transparent resin portion 122 molded around the LED chips and configured to emit light both upward and sideward; and bonding wires electrically connecting the LED chips to a printed circuit board (PCB). In this embodiment, the PCB may constitute a substrate on which a plurality of side and top-emitting LED packages may be placed in a matrix, as further described with reference to FIG. 5. Generally, the transparent resin portion 122 has a flat top surface as illustrated in FIG. 1B.

Figure 2A:
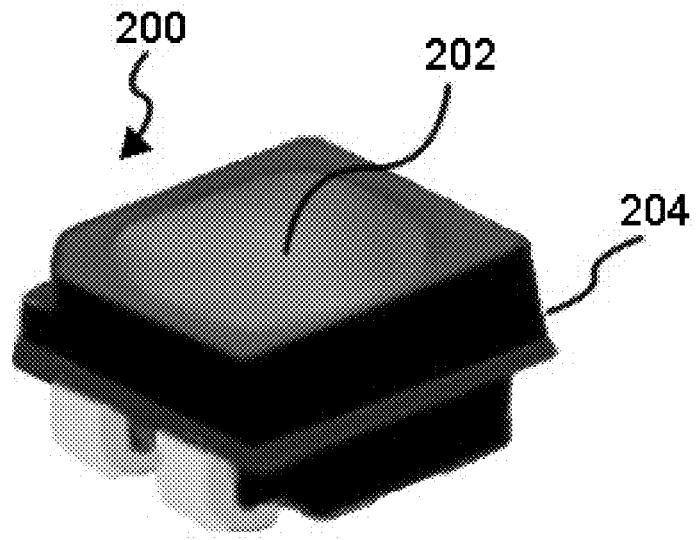
FIG. 2A is a perspective view illustrating a top-emitting LED package illustrated in FIG. 1A.

FIG. 2A is a perspective view illustrating a top-emitting LED package 200. Referring to FIG. 2A, the casing 204 may be formed of a black resin including epoxy or silicone, or other black thermo-plastic material. The use of the black material in SMD packages may improve color contrast.

Further, the circular optical window 202 is configured to provide a symmetry in the viewing orientation, which may reduce color shift either in the horizontal sweep or vertical sweep. In addition, a cavity defined by the black casing 204 functions to bounce and mix red, green, and blue lights within the cavity before the light exits the package, which may reduce spatial color misalignment of the red, green, and blue colors. As a result, the top-emitting LED as shown in FIG. 2A closely follows the Lambertian light pattern.

Figure 2B:
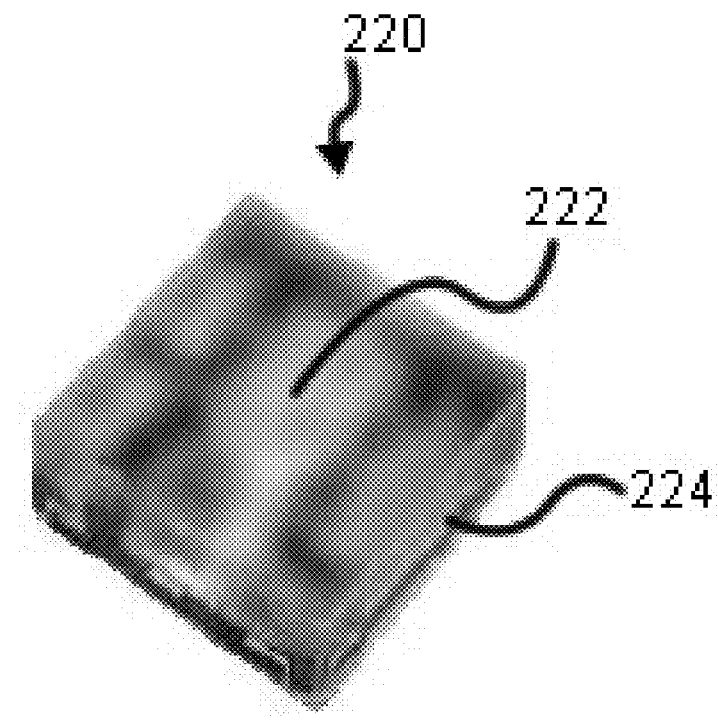
FIG. 2B is a perspective view illustrating a side and top-emitting LED package illustrated in FIG. 1B.

FIG. 2B is a perspective view illustrating a side and top-emitting LED package 220. Referring to FIG. 2B, due to the transparent resin portion 222 molded around the LED chips, the LED 220 can emit light both upward and sideward. Unlike the top-emitting LED package 200, the side and top-emitting LED package 220 may emit light both in the vertical and horizontal directions, and thus the light intensity at a large view angle from the normal angle is higher than that of the top-emitting LED package 200.

However, the side and top-emitting LED 220 has more serious color shift issue than the top-emitting LED 200 because of the 'noisy light' generated by the square-shaped resin portion 222 having a sharp angle and by other irregularity during resin cutting.

In contrast, the color shift is less severe in the top-emitting LED package because light from each LED chip bounces within the package before it is emitted upward, all three color radiations closely follow Lambertian light patterns and thus the color shift over viewing angle variations is less severe.

Figure 3A:
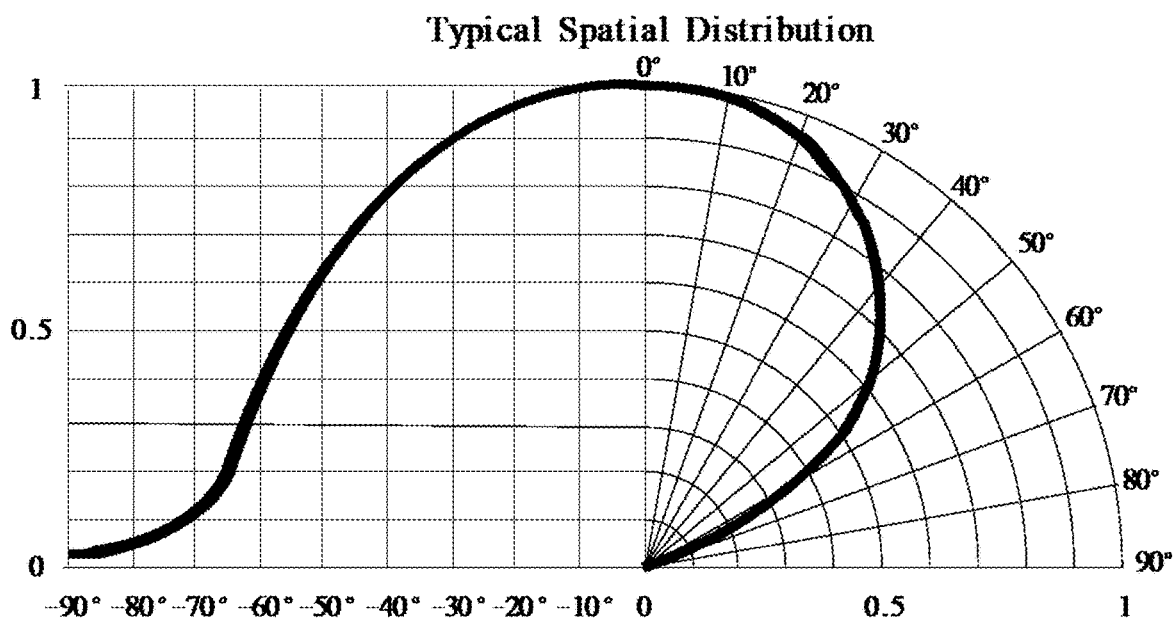
FIG. 3A is a view schematically illustrating a typical spatial distribution of the relative luminous intensity over viewing angles for a top-emitting LED package.
Figure 3B:
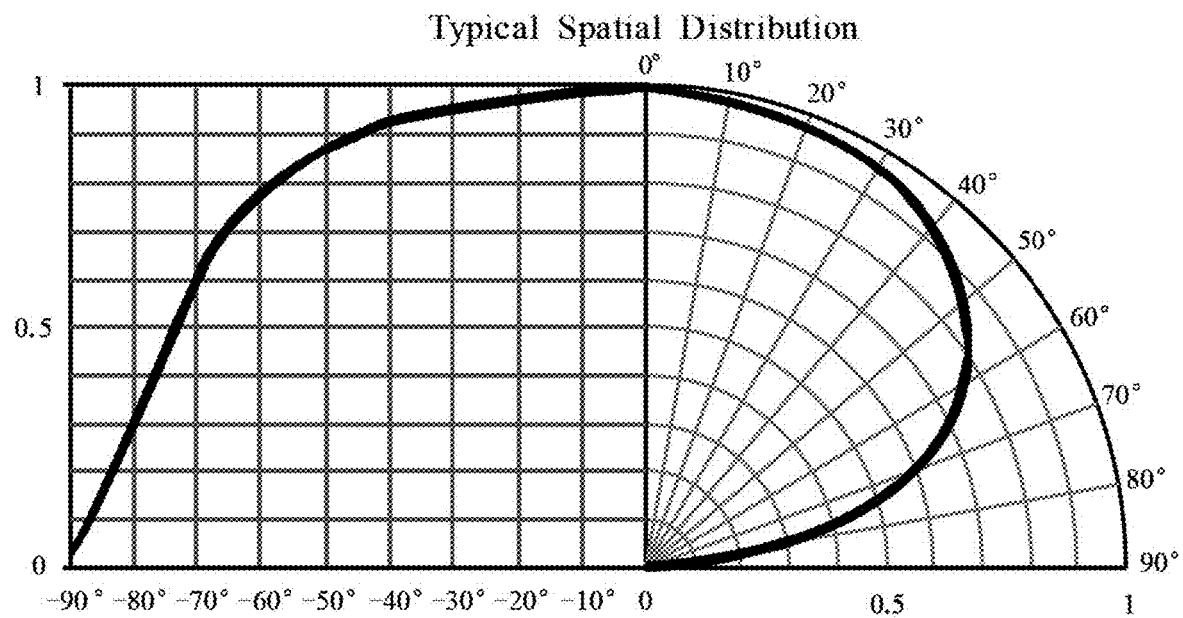
FIG. 3B is a view schematically illustrating a typical spatial distribution of the relative luminous intensity over viewing angles for a side and top-emitting LED package.

FIGS. 3A and 3B schematically illustrate typical spatial distributions of the relative luminous intensity over viewing angles for a top-emitting LED package 200 and a side and top-emitting LED package 220, respectively. As shown here, the side and top-emitting LED 220 has a higher light intensity at large viewing angle due to the light emitted sideward, while the top-emitting LED 200 closely follows Lambertian light patterns.

Figure 4A:
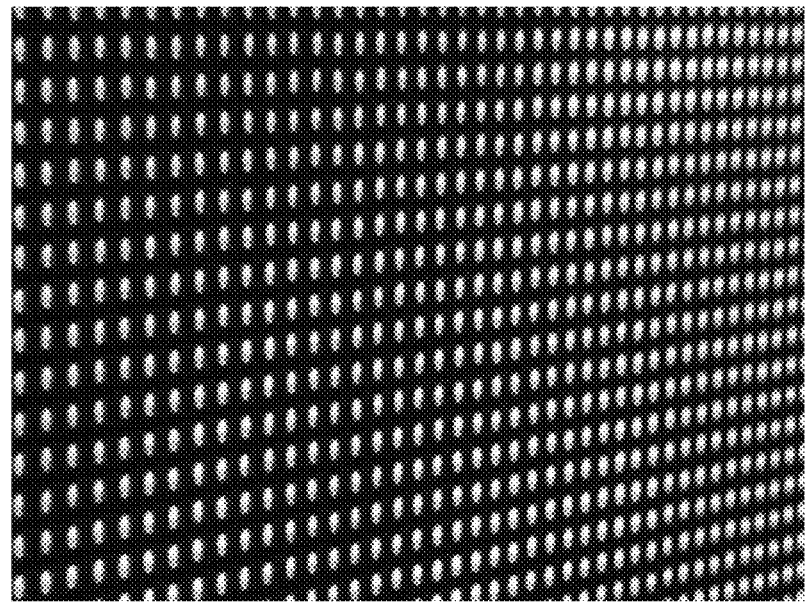
FIG. 4A is a view illustrating a typical color shift over viewing angle variations for an array of the top-emitting LED packages.
Figure 4B:
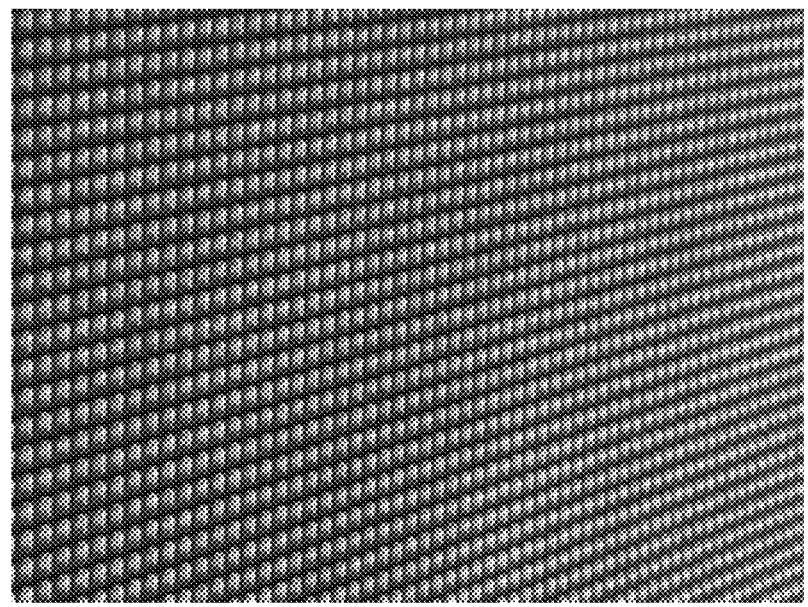
FIG. 4B is a view illustrating a typical color shift over viewing angle variations for an array of the side and top-emitting LED packages.

FIGS. 4A and 4B illustrate a typical color shift over viewing angle variations for an array of the top-emitting LED packages and the side and top-emitting LED packages, respectively. Comparing FIG. 4A and FIG. 4B, the array of the side and top-emitting LED 220, as shown in FIG. 4B, has more serious color shift than the array of the top-emitting LED 200, as shown in FIG. 4A.

Each SMD contains red, green, and blue LEDs, and when three LED chips with different colors are put together, the resulting mixed color can be different when viewed from different viewing angles. If the normal viewing is calibrated for a given color (e.g., white), color can shift to reddish or bluish at large viewing angle depending on the mismatch of light pattern with the viewing angle of each color.

Figure 5:
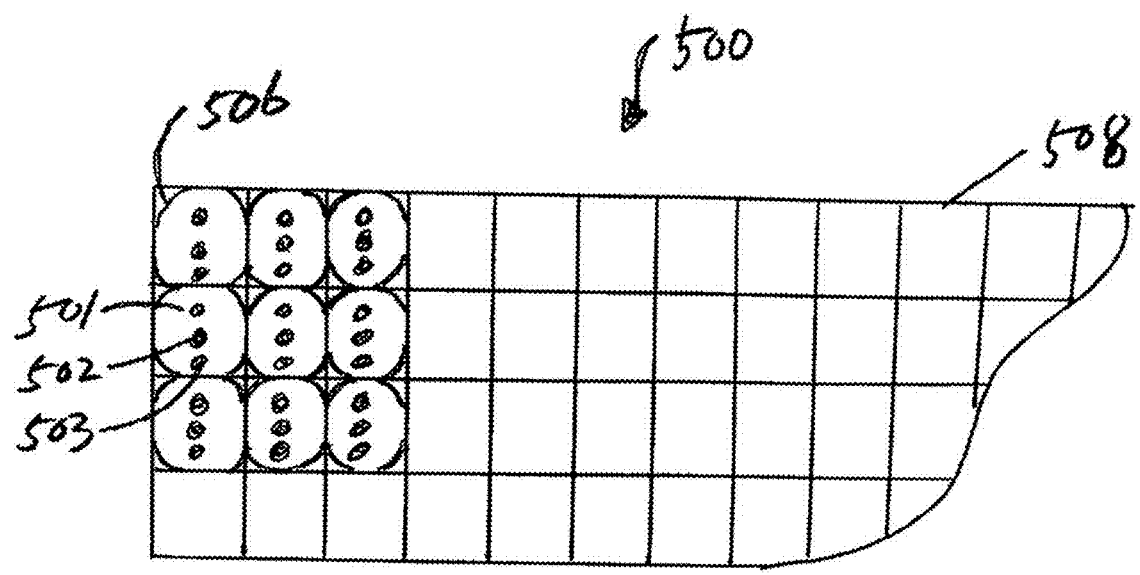
FIG. 5 is a plan view schematically illustrating an LED display module.

FIG. 5 is a plan view schematically illustrating an LED display module. Referring to FIG. 5, an LED display module 500 comprises a plurality of surface-mount devices (SMDs) 506 arranged in rows and columns, each SMD including red, green, and blue LEDs 501, 502 and 503 to define a pixel. The SMD devices 506 are electrically connected to pads on the PCB 508 to respond to appropriate electrical signals from a controller.

Figure 6:
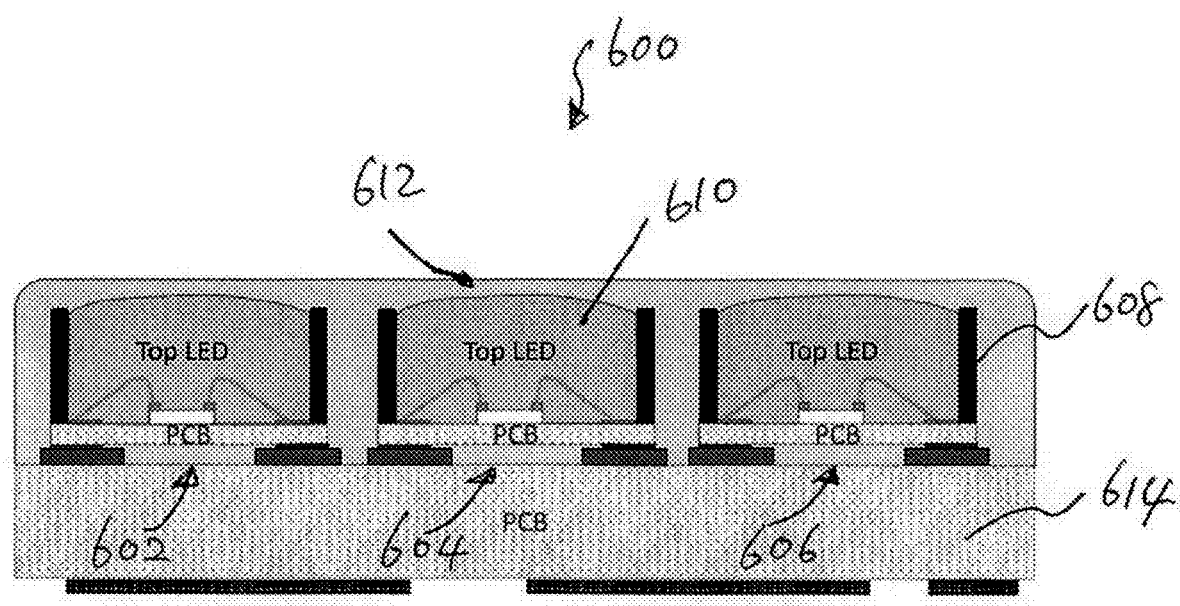
FIG. 6 is a view schematically illustrating a cross section of an LED display module comprising an array of top-emitting LED packages according to an embodiment.

FIG. 6 is a view schematically illustrating a cross section of an LED display module 600 comprising an array of top-emitting LED packages 602, 604, 606 according to an embodiment. Referring to FIG. 6, a light emitting diode (LED) display module 600 comprises an array of surface-mount devices (SMDs) arranged in a matrix on a printed circuit board (PCB) 614. Each SMD comprises red, green and blue LED chips, a black side wall 608 defining a cavity, and a first transparent resin portion 610 molded around the LED chips in the cavity. The LED display module further comprises a second transparent resin portion 612 molded on the first transparent resin portion 610 and molded around each SMD in a manner to fill spaces between SMDs.

When a plurality of top-emitting LED packages are put together on a display board, the resulting light pattern still exhibits some level of color shift due to two reasons: (1) uneven surfaces from which light exits, and (2) variations of the uneven surfaces between SMDs. However, as illustrated in FIG. 6, by providing a second transparent resin portion 612 molded on the first transparent resin portion 610 and molded around each SMD in a manner to fill spaces between SMDs, a more uniform and flat surface may be formed so as to minimize or eliminate the color shift problem.

Figure 7:
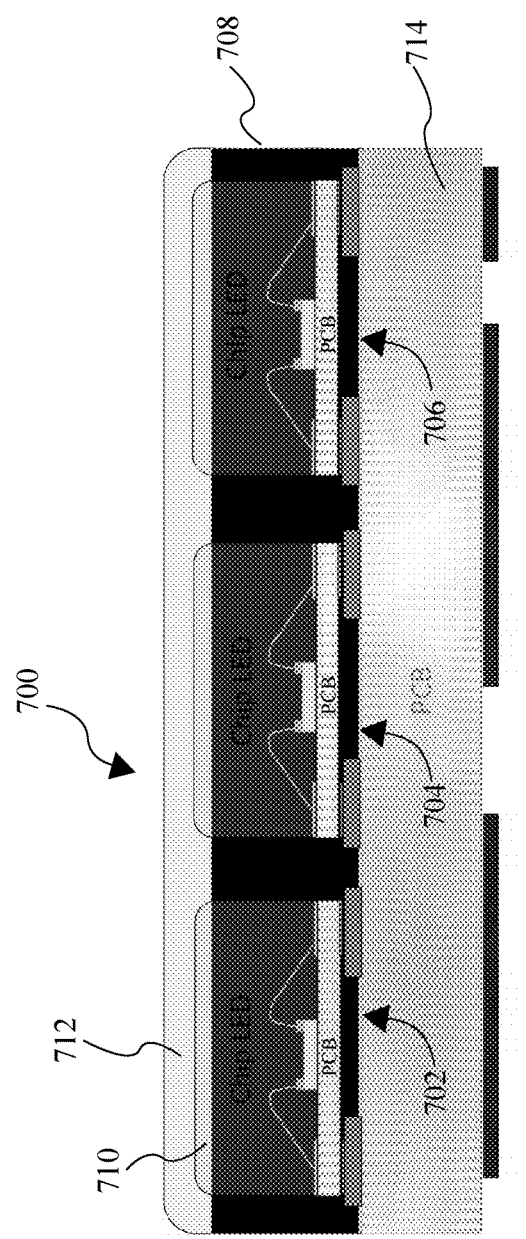
FIG. 7 is a view schematically illustrating a cross section of an LED display module comprising an array of side and top-emitting LED packages according to an embodiment.

FIG. 7 is a view schematically illustrating a cross section of an LED display module comprising an array of side and top-emitting LED packages according to another embodiment. Referring to FIG. 7, a light emitting diode (LED) display module 700 includes an array of surface-mount devices (SMDs) 702, 704, 706 arranged in rows and columns on a substrate 714. Each SMD comprises red, green, and blue LED chips connected to a PCB substrate.

The LED display module 700 further comprises a first transparent resin portion 710 molded around the LED chips, a black resin portion 708 molded around each SMD in a manner to fill spaces between SMDs so as to block light emitted from a sidewall of each SMD, and a second transparent resin portion 712 molded on the first transparent resin portion 710 and the black resin portion 708. In this embodiment, the second transparent resin portion has a thickness ranging from 100 µm to 700 µm.

In this embodiment, by forming a black resin portion 708 around each SMD in a manner to fill spaces between SMDs, the noisy light can be blocked by the black resin portion 708, thereby minimizing or eliminating the color shift phenomenon.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. For example, according to the desired optical effects of the LED display, the top surface of the second transparent resin portion, e.g., 612 and 712, may be flat, in a concave shape, in a convex shape, or a combination of a flat portion and a concave or convex portion. The thickness of the second transparent resin portion can also vary, e.g., in the range of 50 µm to 1000 µm, 70 µm to 700 µm, 100 µm to 700 µm, or 50 µm to 500 µm.

Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure

What is claimed is:

1. A light emitting diode (LED) display module, comprising:
an array of surface-mount devices (SMDs) arranged in rows and columns on a substrate, each SMD comprising red, green, and blue LED chips connected to the substrate, and a first transparent resin portion molded around the LED chips;
a black resin portion molded around each SMD in a manner to fill spaces between adjacent SMDs in the array of SMDs so that the black resin is in contact with a sidewall of each SMD and is exposed to and blocks light emitted from each SMD when the display module is lit; and a second transparent resin portion molded on the first transparent resin portion and the black resin portion.

2. The LED display module of claim 1, wherein the substrate comprises a printed circuit board (PCB).

3. The LED display module of claim 2, wherein each SMD is electrically connected to pads on the PCB to respond to electrical signals from a controller.

4. The LED display module of claim 1, wherein the first transparent resin portion is made from an epoxy or a silicone.

5. The LED display module of claim 1, wherein the second transparent resin portion is made of the same material as that of the first transparent resin portion.

6. The LED display module of claim 1, wherein the black resin portion is made of a mixture of black pigment and a resin, an epoxy, or a silicone.

7. The LED display module of claim 1, wherein the first transparent resin portion has flat top and side surfaces.

8. The LED display module of claim 1, wherein the red, green and blue LED chips are arranged in a linear shape.

9. The LED display module of claim 1, wherein the second transparent resin portion has a thickness ranging from 100 μm to 700 μm.

10. The LED display module of claim 1, wherein the second transparent resin portion has a surface having on or more portions that is flat, in a concave shape, or in a convex shape.

11. A light emitting diode (LED) display module, comprising:
an array of surface-mount devices (SMDs) arranged in a matrix on a substrate, each SMD comprising red, green, and blue LED chips, a black sidewall defining a cavity, and a first transparent resin portion molded in the cavity, wherein the black sidewall is exposed to and blocks lights emitted from the LED chips when the display module is lit; and
a second transparent resin portion molded on the first transparent resin portion and molded around each SMD in a manner to fill spaces between adjacent SMDs in the array of SMDs.

12. The LED display module of claim 11, wherein the second transparent resin portion has flat top and side surfaces.

13. The LED display module of claim 11, wherein the substrate comprises a printed circuit board (PCB).

14. The LED display module of claim 11, wherein each SMD has a circular optical window so as to reduce color shift.

15. The LED display module of claim 11, wherein the second transparent resin portion is made of the same material as that of the first transparent resin portion.

16. The LED display module of claim 11, wherein the black sidewall is made of a mixture of black pigment and a resin, an epoxy, or a silicone.

17. The LED display module of claim 11, wherein the second transparent resin portion has a surface having on or more portions that is flat, in a concave shape, or in a convex shape.

18. A method for fabricating a light emitting diode (LED) display module, the method comprising:
providing an array of surface-mount devices (SMDs) arranged in a matrix on a substrate, each SMD comprising red, green and blue LED chips connected to the substrate and a first transparent resin portion molded around the LED chips;
forming a black resin portion molded around each SMD in a manner to fill spaces between adjacent SMDs in the array of SMDs so that the black resin is in contact with a sidewall of each SMD and is exposed to and blocks light emitted from each SMD when the display module is lit; and
forming a second transparent resin portion on the first transparent resin portion and the black resin portion.

* * * * *